United States Patent
Han

(10) Patent No.: US 11,133,413 B2
(45) Date of Patent: Sep. 28, 2021

(54) HIGH VOLTAGE PMOS (HVPMOS) TRANSISTOR WITH A COMPOSITE DRIFT REGION AND MANUFACTURE METHOD THEREOF

(71) Applicant: Silergy Semiconductor Technology (Hangzhou) LTD, Hangzhou (CN)

(72) Inventor: Chenggong Han, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 473 days.

(21) Appl. No.: 16/010,002

(22) Filed: Jun. 15, 2018

(65) Prior Publication Data
US 2018/0294355 A1 Oct. 11, 2018

Related U.S. Application Data

(63) Continuation of application No. 14/277,245, filed on May 14, 2014, now abandoned.

(30) Foreign Application Priority Data

May 22, 2013 (CN) .......................... 201310194265.5

(51) Int. Cl.
*H01L 29/78* (2006.01)
*H01L 29/66* (2006.01)
(Continued)

(52) U.S. Cl.
CPC ...... *H01L 29/7835* (2013.01); *H01L 29/0847* (2013.01); *H01L 29/0878* (2013.01);
(Continued)

(58) Field of Classification Search
CPC ............ H01L 29/0878; H01L 29/0882; H01L 29/0886; H01L 29/42368; H01L 29/66659;
(Continued)

(56) References Cited

U.S. PATENT DOCUMENTS 5,981,997 A * 11/1999 Kitamura ............ H01L 29/0847
257/335
6,023,090 A 2/2000 Letavic
(Continued)

FOREIGN PATENT DOCUMENTS

| CN | 102437192 A | 5/2012 |
| CN | 103456784 A | 5/2012 |

OTHER PUBLICATIONS

A. K. Paul, "High Voltage LDMOS Transistors in Sub-Micron SOI Films," IEEE, Proc. ISPSD, Dec. 31, 1996, pp. 89-92.

*Primary Examiner* — Marcos D. Pizarro
(74) *Attorney, Agent, or Firm* — Michael C. Stephens, Jr.

(57) ABSTRACT

In one embodiment, method of making a high voltage PMOS (HVPMOS) transistor, can include: (i) providing a P-type substrate; (ii) implanting N-type dopants in the P-type substrate; (iii) dispersing the implanted N-type dopants in the P-type substrate to form a deep N-type well; (iv) implanting P-type dopants of different doping concentrations in the deep N-type well along a horizontal direction of the deep N-type well; and (v) dispersing the implanted P-type dopants to form a composite drift region having an increasing doping concentration and an increasing junction depth along the horizontal direction of the deep N-type well.

5 Claims, 14 Drawing Sheets

(51) Int. Cl.
*H01L 29/08* (2006.01)
*H01L 29/423* (2006.01)
*H01L 29/06* (2006.01)

(52) U.S. Cl.
CPC ...... *H01L 29/0882* (2013.01); *H01L 29/0886* (2013.01); *H01L 29/66659* (2013.01); *H01L 29/66674* (2013.01); *H01L 29/7816* (2013.01); *H01L 29/7833* (2013.01); *H01L 29/7834* (2013.01); *H01L 29/7836* (2013.01); *H01L 29/0653* (2013.01); *H01L 29/42368* (2013.01)

(58) Field of Classification Search
CPC ........... H01L 29/66674; H01L 29/7816; H01L 29/7834; H01L 29/7835; H01L 29/7836
See application file for complete search history.

(56) References Cited

U.S. PATENT DOCUMENTS

| | | |
|---|---|---|
| 7,663,203 B2 | 2/2010 | Knaipp |
| 7,888,222 B2 | 2/2011 | You et al. |
| 8,217,452 B2 | 7/2012 | Toren et al. |
| 2002/0079509 A1 | 6/2002 | Efland et al. |
| 2007/0120187 A1 | 5/2007 | Udrea |
| 2011/0156142 A1 | 6/2011 | Teo et al. |
| 2011/0233670 A1 | 9/2011 | French |
| 2012/0293191 A1 | 11/2012 | Chen et al. |
| 2013/0234246 A1 | 9/2013 | Yang et al. |

\* cited by examiner

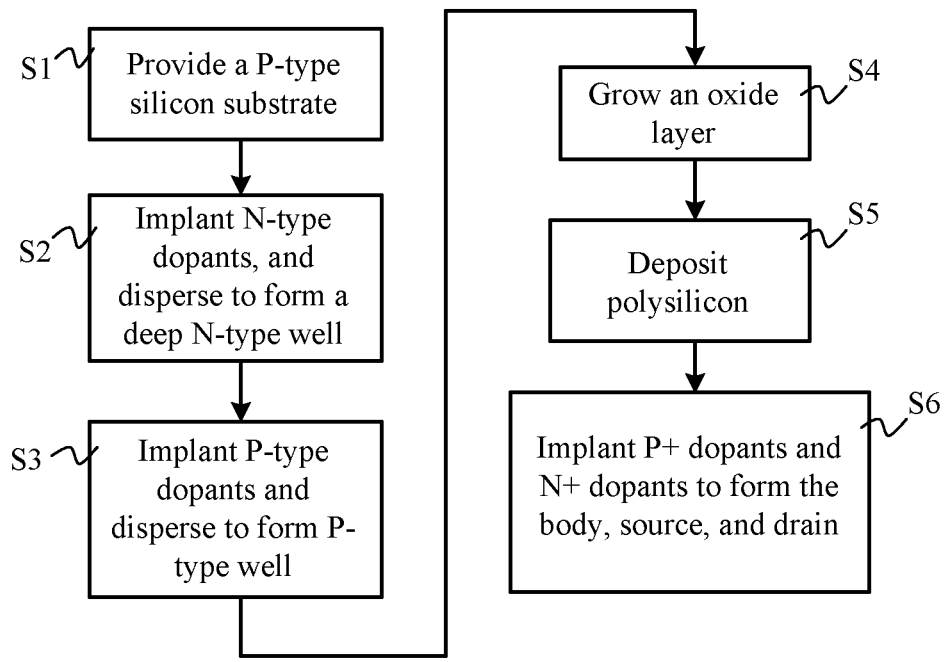
FIG. 1 (conventional)

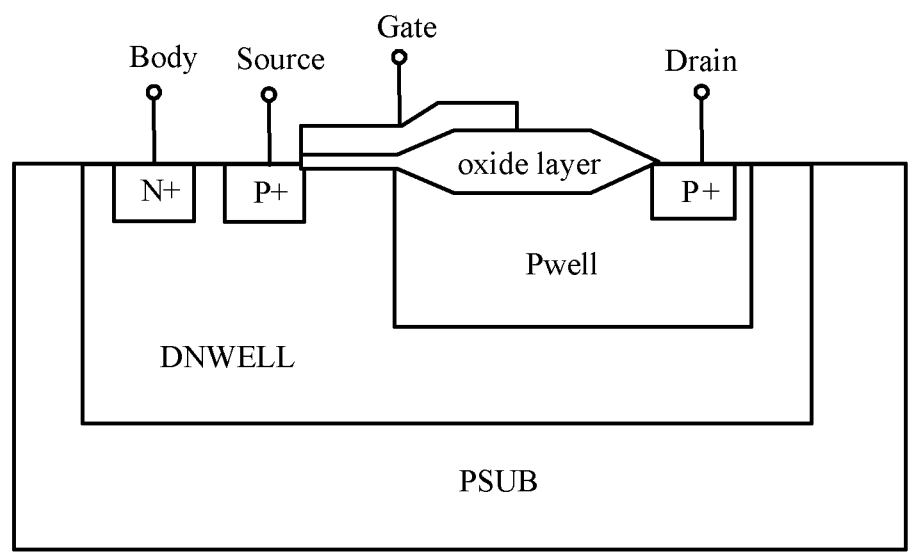
FIG. 2 (conventional)

HIGH VOLTAGE PMOS (HVPMOS) TRANSISTOR WITH A COMPOSITE DRIFT REGION AND MANUFACTURE METHOD THEREOF

RELATED APPLICATIONS

This application is a continuation of the following application, U.S. patent application Ser. No. 14/277,245, filed on May 14, 2014, and which is hereby incorporated by reference as if it is set forth in full in this specification, and which also claims the benefit of Chinese Patent Application No. 201310194265.5, filed on May 22, 2013, which is incorporated herein by reference in its entirety.

FIELD OF THE INVENTION

The present invention relates to semiconductor devices, and more particularly to a high voltage PMOS (HVPMOS) transistor with a composite drift region formed by implantation, and an associated manufacturing method.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. In this way, the output voltage and/or the output current of the switching power supply can be maintained as substantially constant. Therefore, the selection and design of the particular control circuitry and approach, as well as the types of circuit components, can be important to the overall performance of the switching power supply. For example, HVPMOS transistors can be employed as switching devices in an SMPS.

SUMMARY

In one embodiment, a high voltage PMOS (HVPMOS) transistor can include: (i) a P-type substrate; (ii) a deep N-type well in the P-type substrate; and (iii) a composite drift region in the deep N-type well, where the composite drift region comprises an increasing doping concentration and an increasing junction depth along a horizontal direction of the deep N-type well.

In one embodiment, method of making an HVPMOS transistor, can include: (i) providing a P-type substrate; (ii) implanting N-type dopants in the P-type substrate; (iii) dispersing the implanted N-type dopants in the P-type substrate to form a deep N-type well; (iv) implanting P-type dopants of different doping concentrations in the deep N-type well along a horizontal direction of the deep N-type well; and (v) dispersing the implanted P-type dopants to form a composite drift region having an increasing doping concentration and an increasing junction depth along the horizontal direction of the deep N-type well.

BRIEF DESCRIPTION OF THE DRAWINGS

FIG. 1 is a flow diagram of an example method of making an HVPMOS transistor using a BCD process.

FIG. 2 is a cross-section diagram of an example HVPMOS transistor formed by a BCD process.

DETAILED DESCRIPTION

Figure 3:
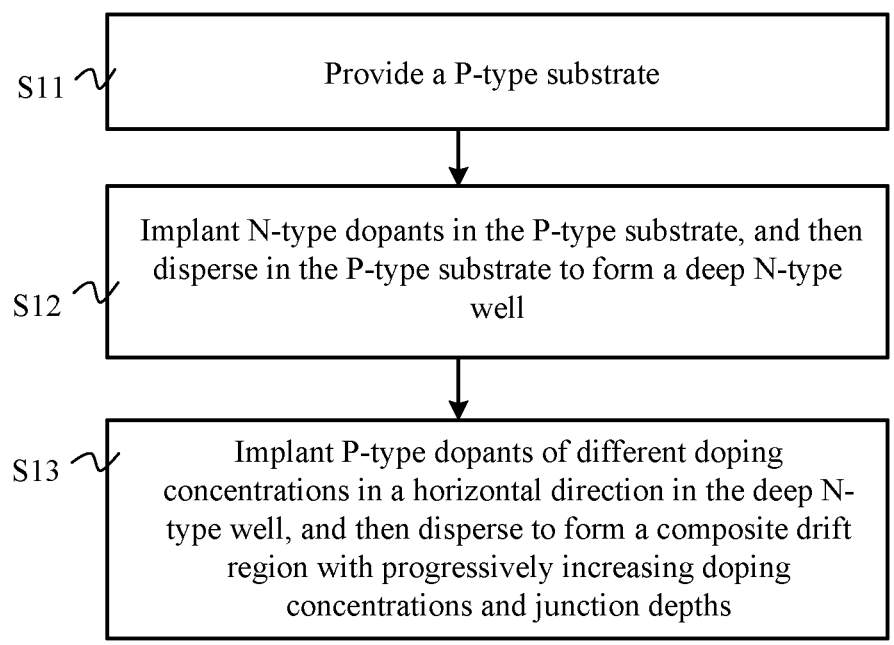
FIG. 3 is a flow diagram of an example method of making an HVPMOS transistor with a composite drift region, in accordance with the embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A high voltage PMOS transistor (HVPMOS) can be employed as a power device or switch in a switched-mode power supply (SMPS) or a "switching" power supply. In some cases, an HVPMOS transistor can be used in conjunction with a laterally diffused metal oxide semiconductor (LDMOS) transistor (e.g., an N-LDMOS) in a switching regulator. In one example, an HVPMOS transistor can be made by a standard BCD (Bipolar-CMOS-DMOS) process. There are typically four terminals for a HVPMOS: gate, body, source, and drain. When a voltage between the source and gate V(sg) is lower than a threshold voltage (Vth) of the HVPMOS transistor, the HVPMOS can be turned off to prevent a high voltage at the source from passing through the transistor. Conversely, when the voltage V(sg) between the source and gate is higher than threshold voltage Vth, the HVPMOS transistor can be turned on to conduct current between the source and drain. Thus, an HVPMOS transistor can be employed as a switch in many applications.

Breakdown voltage (BV) and on resistance (Ron) are important parameters for a HVPMOS transistor. Breakdown voltage BV can represent a maximum reverse voltage that can be accommodated by such power devices/transistors. Therefore, the higher the breakdown voltage, the better the power device (e.g., HVPMOS transistor) can perform, such as in a switching regulator application. Also, the lower the on resistance (Ron), the better the power device can decrease power losses across the power device. Referring now to FIG. 1, shown is a flow diagram of an example method of making an HVPMOS transistor using a BCD process. Also shown in FIG. 2 is a cross-section diagram of an example HVPMOS transistor formed by such a BCD process.

At S1, a P-type silicon substrate (PSUB) can be provided. At S2, N-type dopants can be implanted and dispersed to form a deep N-type well (DNWELL). For example, N-type impurities or dopants (e.g., phosphorus, etc.) can be implanted in the PSUB and dispersed to form a DNWELL as the channel of an HVPMOS transistor. At S3, P-type impurities or dopants (e.g., boron, etc.) can be implanted and dispersed to form a P-type well (Pwell). For example, P-type impurities can be implanted in the DNWELL, and then may be disbursed to form a Pwell as a "drift" region of the HVPMOS transistor.

At S4, an oxide layer can be grown. For example, the oxide can be grown over PSUB on a portion of DNWELL in which a Pwell has been formed. At S5, polysilicon can be deposited, e.g., on oxide to form a gate of the HVPMOS transistor. At S6, P+ dopants and N+ dopants to form the body, source, and drain regions and/or contact points, for the HVPMOS transistor. For example, on a portion of DNWELL that is not overlapped by oxide, P+ impurity can be implanted to form a source, and N+ impurity can be implanted to form a diffusion region for a body contact. Also, the drain can be formed by implanting P+ impurity on a portion of Pwell that is not overlapped by the oxide.

In some approaches, Pwell employed as the drift region can be formed by implanting and dispersing P-type impurity to make an HVPMOS transistor by a BCD process. However, with a BCD processing approach, it may be difficult to control the implantation dosage of the Pwell, and HVPMOS transistor performance limitations can result. For example, if the implantation dosage is too large, the breakdown voltage of the transistor may be decreased. Also, if the implantation dosage is too small, the on resistance of the HVPMOS transistor may be increased.

In one embodiment, method of making an HVPMOS transistor, can include: (i) providing a P-type substrate; (ii) implanting N-type dopants in the P-type substrate; (iii) dispersing the implanted N-type dopants in the P-type substrate to form a deep N-type well; (iv) implanting P-type dopants of different doping concentrations in the deep N-type well along a horizontal direction of the deep N-type well; and (v) dispersing the implanted P-type dopants to form a composite drift region having an increasing doping concentration and an increasing junction depth along the horizontal direction of the deep N-type well.

Referring now to FIG. 3, shown is a flow diagram of an example method of making an HVPMOS transistor with a composite drift region, in accordance with the embodiments of the present invention. This manufacturing method of an HVPMOS transistor with a composite drift region will be described in conjunction with the example transistor devices shown in FIGS. 6, 8, 11, and 13. At S11, a P-type substrate (PSUB) can be provided. At S12, N-type dopants (e.g., phosphorus, etc.) can be implanted in the P-type substrate, and then dispersed in the P-type substrate to form a deep N-type well (DNWELL), which can be configured as the channel of the HVPMOS transistor.

At S13, P-type dopants (e.g., boron, etc.) of different doping concentrations along a horizontal direction (e.g., left to right in FIG. 6) can be implanted in the deep N-type well (DNWELL), and then dispersed to form corresponding (adjacent) drift regions. For example, the doping concentrations and junction depths of the drift regions can be increased in sequence along the horizontal direction, with each drift region to the right having a higher doping concentration and junction depth than the drift region immediately to its left. In this fashion, a composite drift region of progressively increased doping concentration and junction depth can be configured along the horizontal direction of the deep N-type well (DNWELL). In particular embodiments, an HVPMOS transistor with a composite drift region can be formed, e.g., using S11 to S13, and which can include a P-type substrate, a deep N-type well in the P-type substrate, and a composite drift region with progressively increased doping concentration and junction depth in the deep N-type well along the horizontal direction.

Therefore, the composite drift region of the HVPMOS transistor does not utilize a conventional drift region that is formed by only once implanting single P-type dopants, such as in a BCD process. In certain embodiments, P-type dopants can be implanted several (e.g., at least two) times, and dispersed to form corresponding adjacent drift regions of the composite drift region. Also, the performance of the composite drift region can be regulated by adjustment of the doping concentration and/or junction depth of the drift region, such as at one or more of the drift region formation steps. Further, implantation dosage of the composite drift region can be more accurately controlled for an HVPMOS transistor in particular embodiments.

The composite drift region can be configured to be in the deep N-type well, and the surface of the deep N-type well that is adjacent to the P-type substrate may have better surface homogeneity, as compared to other approaches. Therefore, the intrinsic breakdown performance of an HVPMOS transistor of particular embodiments can be improved relative to the breakdown performance that can occur on a more conventional device surface. In addition, along the horizontal direction of the deep N-type well, the doping concentration of the drift region (e.g., at the far left) can be less, and the doping concentration of the remaining drift regions (e.g., in going from left to right in FIG. 6) can be progressively increased. Further, the doping concentration of the composite drift region can be still much higher than conventional approaches in order to decrease the on resistance of the HVPMOS transistor.

Figure 4:
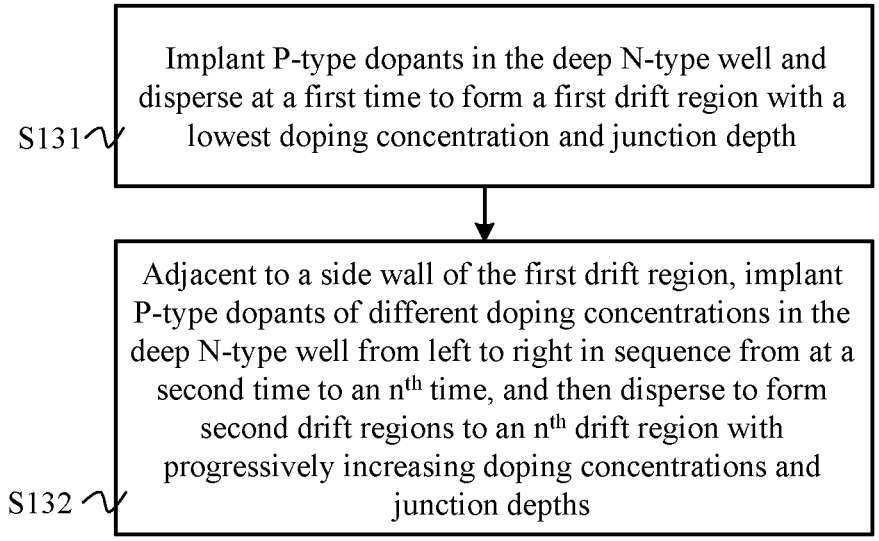
FIG. 4 is a flow diagram of an example method of making a composite drift region of an HVPMOS transistor, in accordance with embodiments of the present invention.

Referring now to FIG. 4, shown is a flow diagram of an example method of making a composite drift region of an HVPMOS transistor, in accordance with embodiments of the present invention. In this example, the example method of forming the composite drift region in step S13 can include the following steps. At S131, P-type dopants can be implanted in the deep N-type well, and may be disbursed at a first time to form a first drift region (Pwell1) with a lowest doping concentration and junction depth. For example, the first drift region (Pwell1) can be formed before formation of a single oxide layer. This can improve the conduction performance of the HVPMOS transistor, and the gate can be formed on the first drift region (Pwell1). This can improve the breakdown voltage due to the lowest doping concentration first drift region (Pwell1) preventing surface breakdown of the HVPMOS transistor when a higher voltage is supplied on the gate.

At S132, adjacent to the side wall of first drift region (Pwell1), P-type dopants of different doping concentrations can be implanted in the deep N-type well from left to right along a horizontal direction. This can be done in sequence at a corresponding second time through an $n^{th}$ time (e.g., second, third, fourth, . . . $n^{th}$), and the P-type dopants can be dispersed to form a second drift region (Pwell2) through an $n^{th}$ drift region with progressively increasing doping concentrations and junction depths along the horizontal direction. For example, "n" can be an integer of at least two.

Although the doping concentration of first drift region Pwell1 is lower, the doping concentration of each of second drift region Pwell2 to the $n^{th}$ drift region can be progressively increased. This can also increase the doping concentration of the composite drift region to decrease the on resistance of the HVPMOS transistor in particular embodiments. In the examples discussed herein, n is two or three to facilitate the description. However, any suitable number of drift regions or value of "n" (of at least two) can be accommodated in particular embodiments, and thus may not limit the number of drift regions of the composite drift region. The particular number of drift regions can be adjusted for a given application to form a suitable composite drift region.

Figure 5:
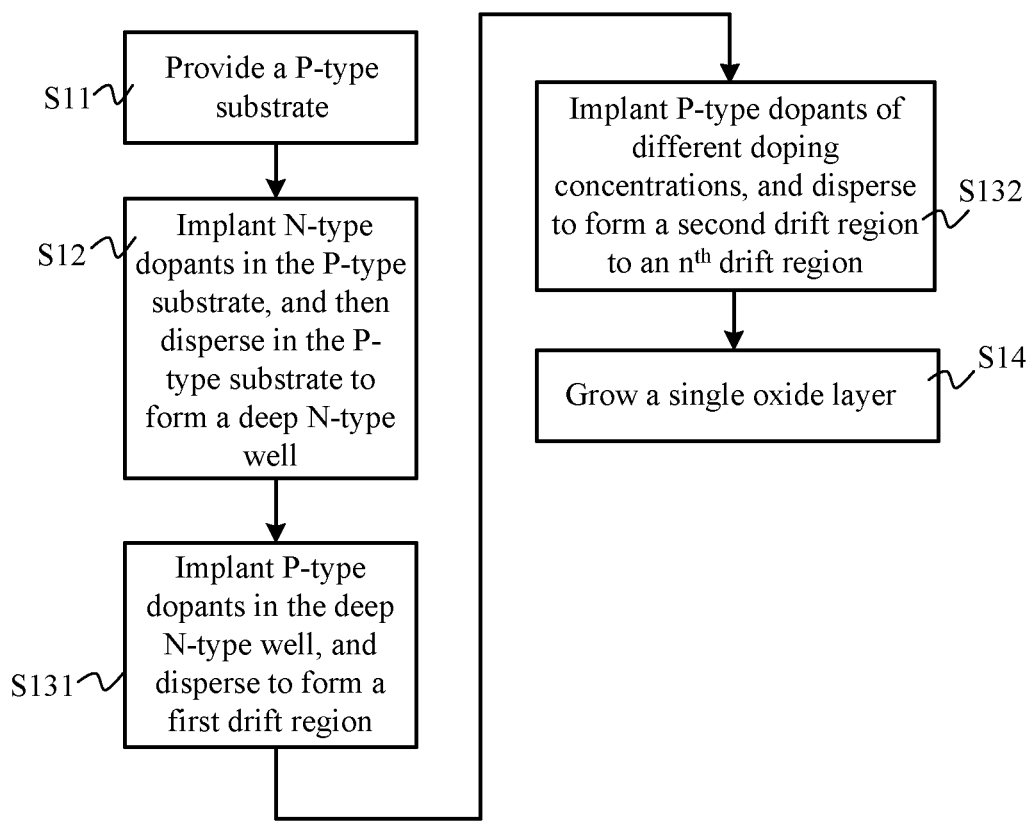
FIG. 5 is a flow diagram of an example method of making an HVPMOS transistor with a single oxide layer and a composite drift region, in accordance with embodiments of the present invention.

Referring now to FIG. 5, shown is a flow diagram of an example method of making an HVPMOS transistor with a single oxide layer and a composite drift region, in accordance with embodiments of the present invention. In this example, after formation of the composite drift region (including first and second drift regions), oxide material can be deposited on the composite drift region to form a single oxide layer, as shown in S14.

Figure 6:
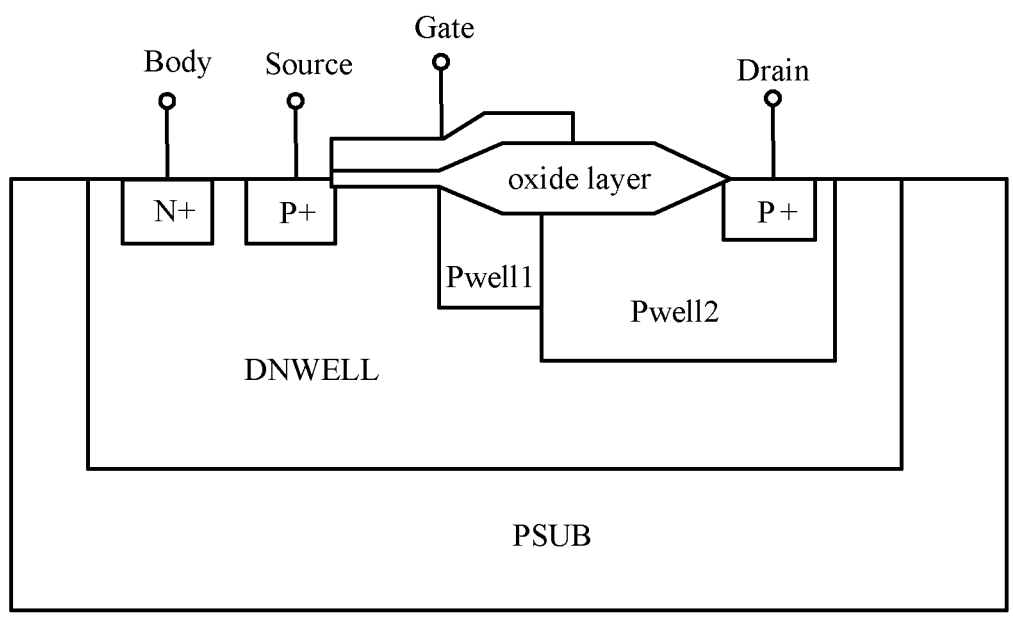
FIG. 6 is a cross-section diagram of an example HVPMOS transistor with a single oxide layer and a composite drift region based on the flow diagram of FIG. 5, and in accordance with embodiments of the present invention.

In one embodiment, an HVPMOS transistor can include: (i) a P-type substrate; (ii) a deep N-type well in the P-type substrate; and (iii) a composite drift region in the deep N-type well, where the composite drift region comprises an increasing doping concentration and an increasing junction depth along a horizontal direction of the deep N-type well. FIG. 6 shows a cross-section diagram of an example HVPMOS transistor with a single oxide layer and a composite drift region based on the flow diagram of FIG. 5, and in accordance with embodiments of the present invention.

Figure 7:
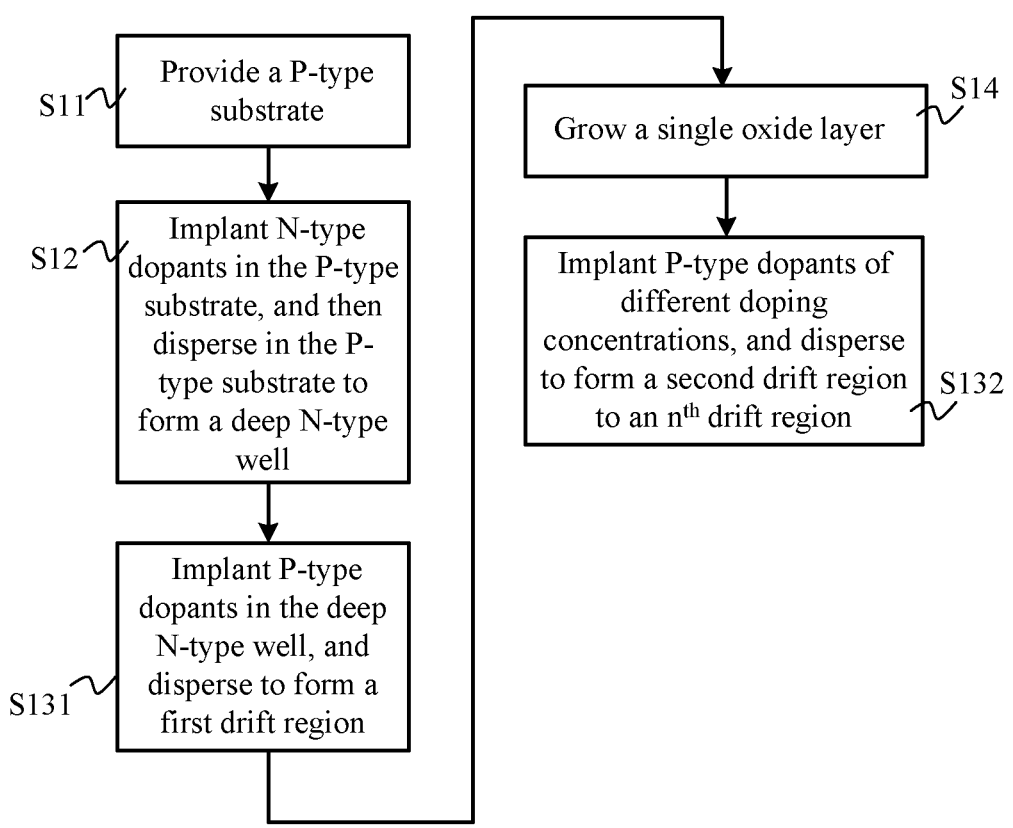
FIG. 7 is a flow diagram of another method of making an HVPMOS transistor with a single oxide layer and a composite drift region, in accordance with embodiments of the present invention.

Referring now to FIG. 7, shown is a flow diagram of another example method of making an HVPMOS transistor with a single oxide layer and a composite drift region, in accordance with embodiments of the present invention. After formation of the first drift region in S131, oxide material can be deposited to form a single oxide layer at S14.

At S132, on a surface of a predetermined region of the composite drift region, the second drift region and third drift regions, etc., can be formed to form the composite drift region.

Figure 8:
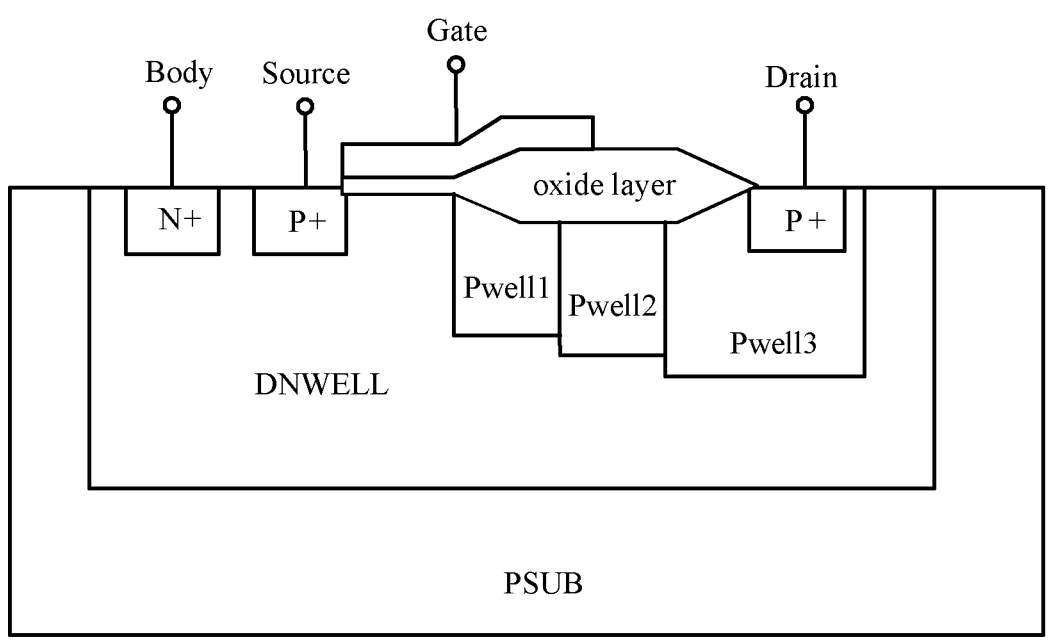
FIG. 8 is a cross-section diagram of an example HVPMOS transistor with a single oxide layer and a composite drift region based on the flow diagram of FIG. 7, and in accordance with embodiments of the present invention.

Referring now to FIG. 8, shown is a cross-section diagram of an example HVPMOS transistor with a single oxide layer and a composite drift region based on the flow diagram of FIG. 7, and in accordance with embodiments of the present invention. In this example, n=3, and three drift regions (e.g., Pwell1, Pwell2, and Pwell3) can form the composite drift region. Here, in step S14 of FIG. 7, the single oxide layer can be formed after the first drift region is formed. However, the sequence of steps of the single oxide layer and the second drift region through the $n^{th}$ drift regions can vary. In accordance with the steps from S11 to S14, the HVPMOS transistor can include a single oxide layer on the composite drift region, as shown in FIG. 8.

Furthermore, with reference to FIGS. 6 and 8, after S14, the example method of making an HVPMOS transistor with a composite drift region can also include depositing polysilicon substantially on the single oxide layer formed on the first drift region (Pwell1) of the composite drift region of a lowest doping concentration and junction depth, to form the gate of the HVPMOS transistor. Also, P+ dopants can be implanted to form the source, and N+ dopants can be implanted to form or allow for the body contact for the HVPMOS transistor, in a remaining region of the deep N-type outside of the composite drift region. Also, P+ dopants can be implanted in the $n^{th}$ drift region (e.g., Pwell3) of the highest doping concentration and junction depth that is adjacent to the single oxide layer to form the drain of the HVPMOS transistor.

In this way, an HVPMOS transistor of particular embodiments can include a gate on a single oxide layer that is on a composite drift region, as discussed herein. Also, the source and body diffusion regions for contacting can be formed in a remaining region of the deep N-type well outside or excluding the composite drift region. The drain can be formed in the drift region of highest doping concentration and junction depth of the composite drift region that is adjacent to the single oxide layer.

Figure 9:
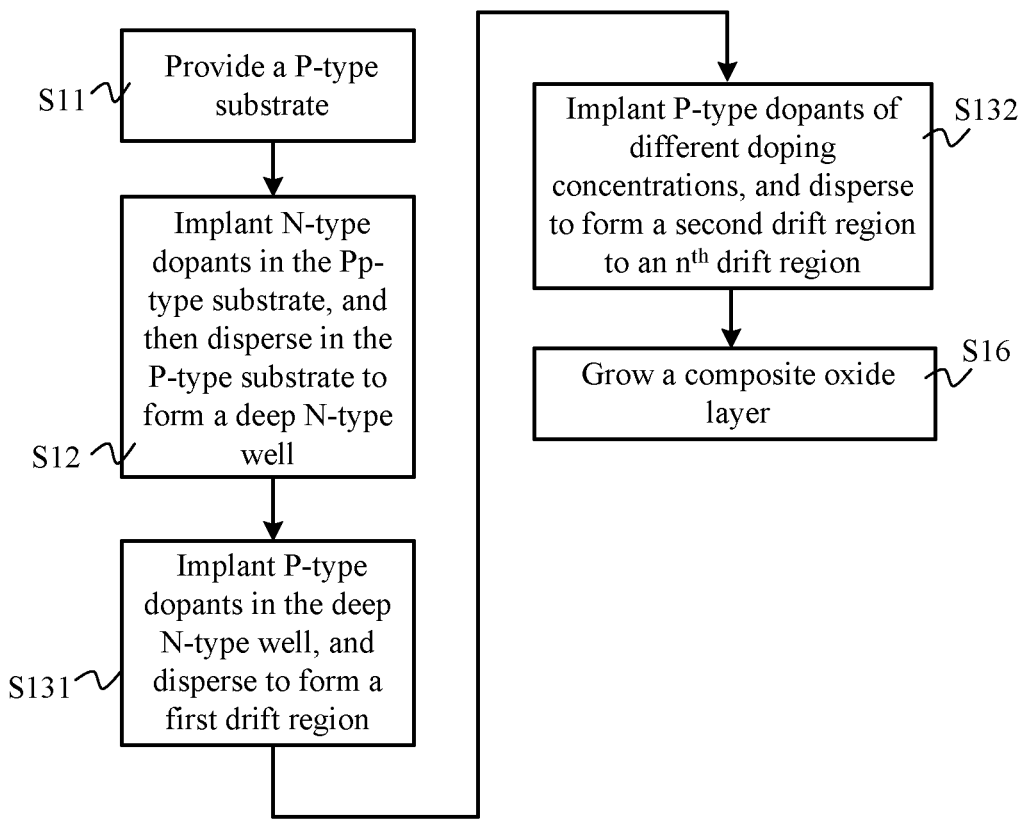
FIG. 9 is a flow diagram of an example method of making an HVPMOS transistor with a composite oxide layer and a composite drift region, in accordance with the embodiments of the present invention.

Referring now to FIG. 9, shown is a flow diagram of an example method of making an HVPMOS transistor with a composite oxide layer and a composite drift region, in accordance with the embodiments of the present invention. After formation of the composite drift region including the first and second drift regions, at S16, oxide material can be deposited on the composite drift region at least twice to form adjacent first oxide layer (Oxide1) and second oxide layer (Oxide2) from left to right in sequence (see, e.g., FIG. 11) to form a composite oxide layer. In this particular example, the first oxide layer (Oxide1) can be formed on the first drift region, and the second oxide layer (Oxide2) can be formed on the second drift region.

Figure 10:
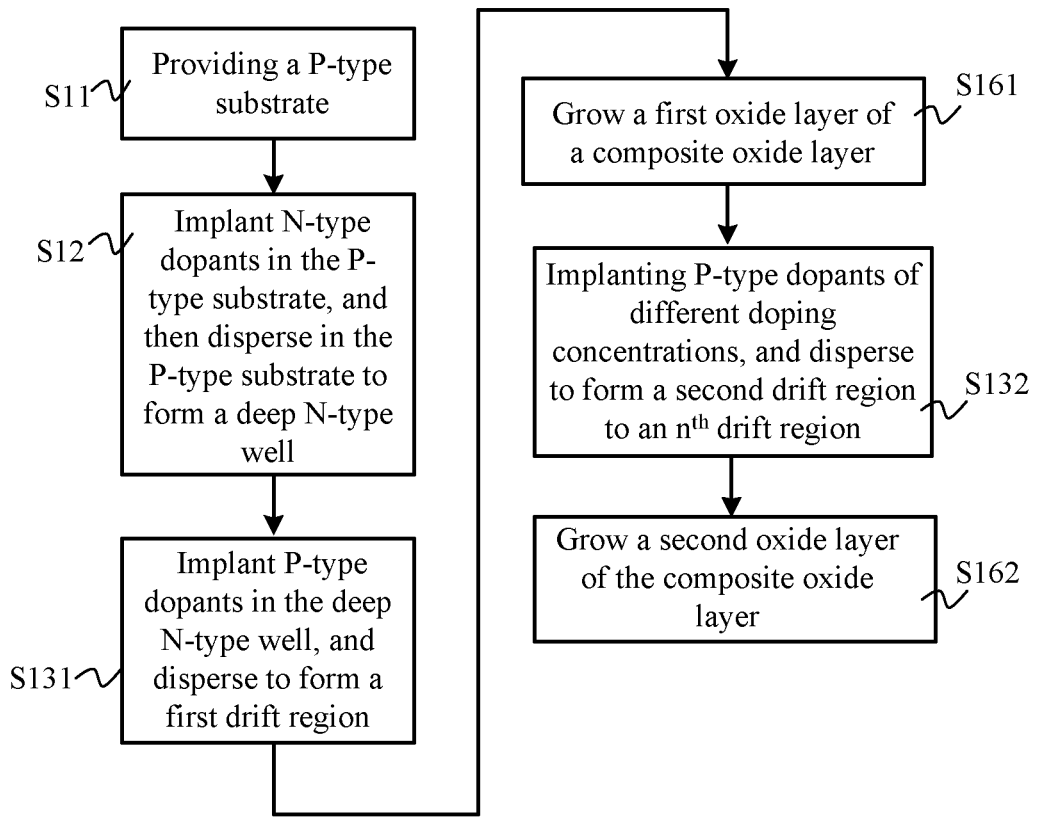
FIG. 10 is a flow diagram of an example method of making an HVPMOS transistor with a composite oxide layer and a composite drift region, in accordance with the embodiments of the present invention.

Referring now to FIG. 10, shown is a flow diagram of an example method of making an HVPMOS transistor with a composite oxide layer and a composite drift region, in accordance with the embodiments of the present invention. After formation of the first drift region, at S161, oxide material can be deposited on the first drift region to form the first oxide layer (Oxide1). In this example, at S132, the second drift region can be formed. At S162, oxide material can be deposited on the second drift region to form the second oxide layer (Oxide2).

Figure 11:
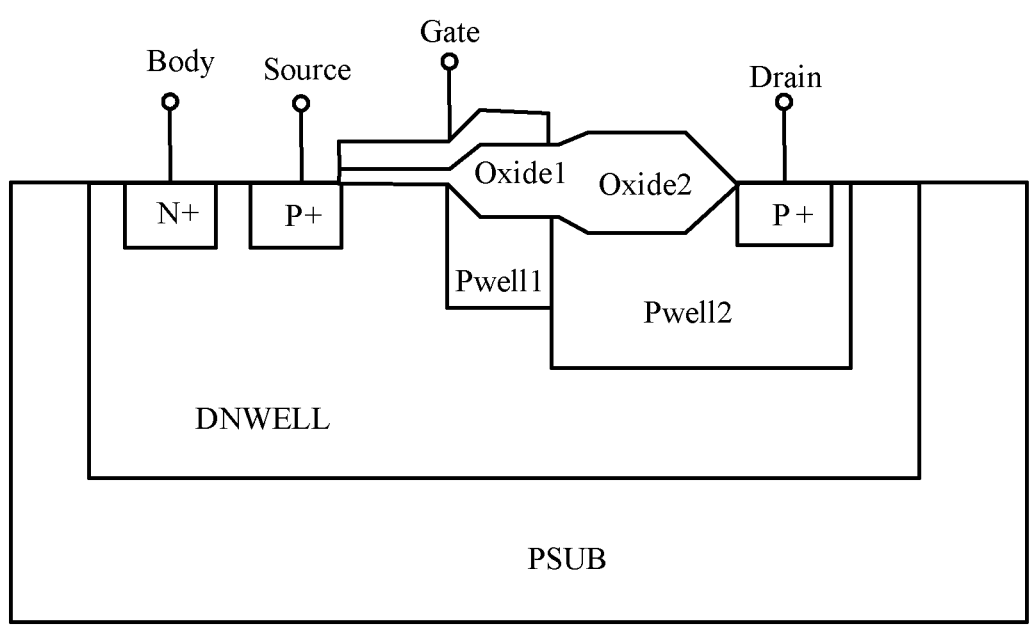
FIG. 11 is a cross-section diagram of an example HVPMOS transistor with a composite oxide layer and a composite drift region based on the flow diagrams of FIGS. 9 and 10, and in accordance with embodiments of the present invention.

Referring now to FIG. 11, shown is a cross-section diagram of an example HVPMOS transistor with a composite oxide layer and a composite drift region based on the flow diagrams of FIGS. 9 and 10, and in accordance with embodiments of the present invention. In this example, the first oxide layer and the second oxide layer are adjacent and arranged in sequence from left to right in a horizontal direction to form the composite oxide layer.

Figure 12:
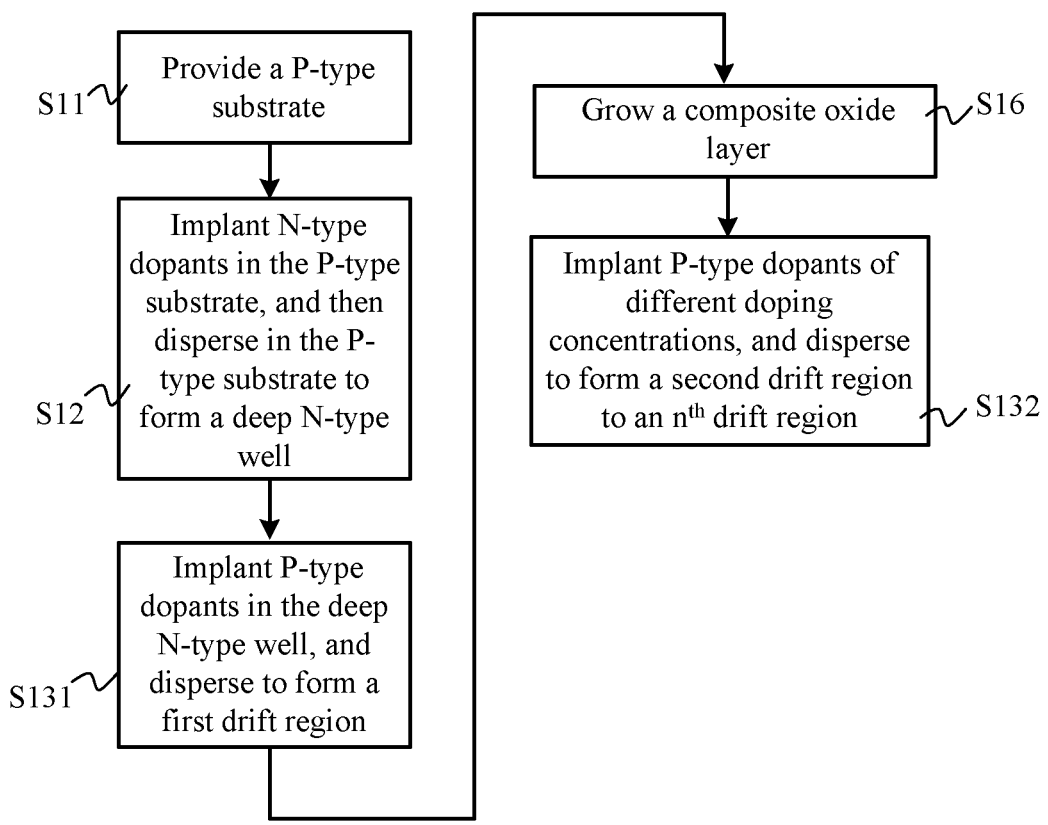
FIG. 12 is a flow diagram of an example method of making an HVPMOS transistor with a composite oxide layer and a composite drift region, in accordance with embodiments of the present invention.

Referring now to FIG. 12, shown is a flow diagram of an example method of making an HVPMOS transistor with a composite oxide layer and a composite drift region, in accordance with embodiments of the present invention. In this example, after formation of the first drift region, oxide material can be deposited on predetermined regions of the composite drift region three times to form the first oxide layer (Oxide1), the second oxide layer (Oxide2), and the third oxide layer (Oxide3) adjacent in sequence from left to right to form the composite oxide layer. For example, the first oxide layer (Oxide1) can be on the first drift region, the second oxide layer (Oxide2) can be on the second drift region, and the third oxide layer (Oxide3) can be on the third drift region.

Figure 13:
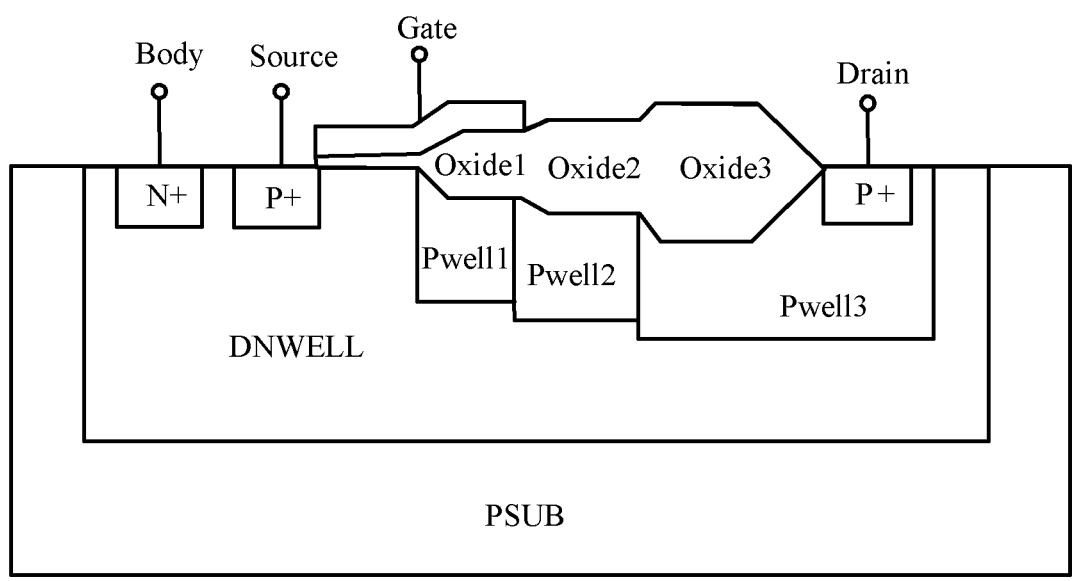
FIG. 13 is a cross-section diagram of an example HVPMOS transistor with a composite oxide layer and a composite drift region based on the flow diagram of FIG. 12, and in accordance with embodiments of the present invention.

Referring now to FIG. 13, shown is a cross-section diagram of an example HVPMOS transistor with a composite oxide layer and a composite drift region based on the flow diagram of FIG. 12, and in accordance with embodiments of the present invention. Based on the implanting process of S132, the second and third drift regions can be formed together with the first drift region to form the composite drift region of Pwell1, Pwell2, and Pwell3.

Thus, an HVPMOS transistor in particular embodiments can also include a composite oxide layer on the composite drift region, which can include at least two adjacent oxide layers from left to right in sequence. Also, thickness of the oxide layers (e.g., Oxide1, Oxide2, Oxide3, etc.) in the composite oxide layer can be identical, or substantially the same, in some cases. In other cases, the thicknesses of the oxide layers (e.g., Oxide1, Oxide2, Oxide3, etc.) can be progressively increased from left to right along the horizontal direction of the deep N-type well, to coincide with the doping concentration and the junction depth of the drift regions. In particular embodiments, the composite oxide layer can be formed by multiple single oxide layers or oxide regions. The number of the single oxide "layers" can be adjusted in the manufacture of an HVPMOS transistor according for a given application.

Figure 14:
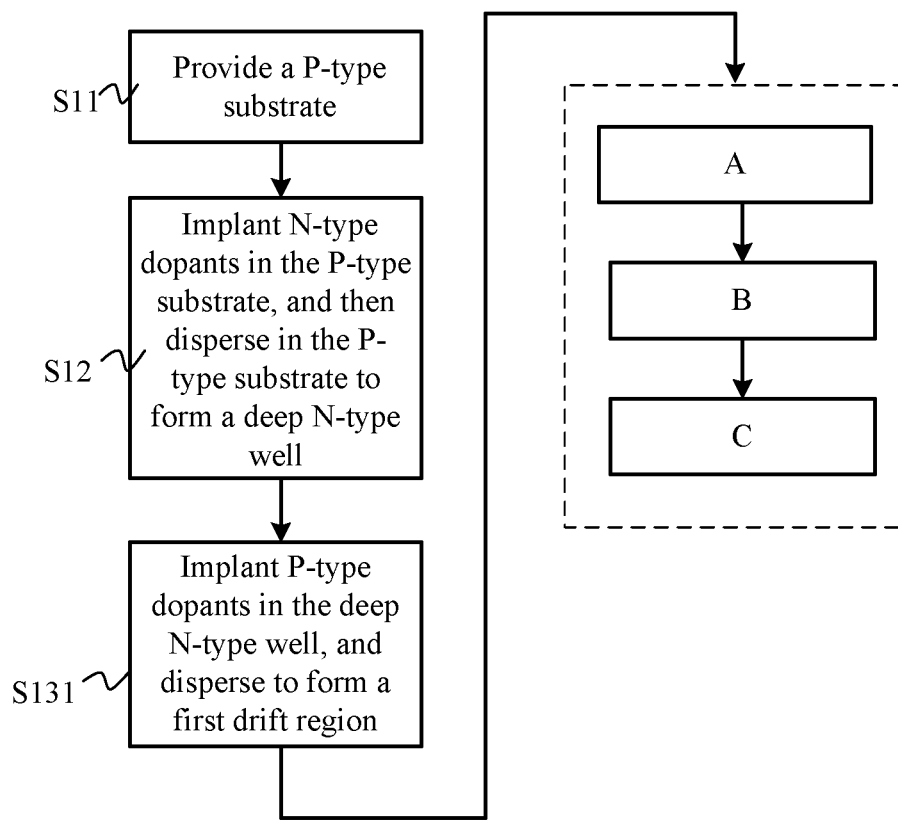
FIG. 14 is a flow diagram of an example method of making a single oxide layer and a drift region, in accordance with embodiments of the present invention.

Referring now to FIG. 14, shown is a flow diagram of an example method of making a single oxide layer and a drift region, in accordance with embodiments of the present invention. The composite oxide layer can include at least two single oxide layers or regions (e.g., Oxide1 and Oxide2), and the composite drift regions can include at least two drift regions. The formation of single oxide layers (Oxide1 and Oxide2) can be respectively labeled as A and B, and the formation of remaining drift regions other than the formation of first drift region (Pwell1) can be labeled as C. In particular embodiments, the sequence of steps A to C can be variable to change or optimize performance of breakdown voltage and/or on resistance of an HVPMOS transistor.

Furthermore, with reference to FIGS. 11 and 13, after S16, the example method of making an HVPMOS transistor with a composite drift region can also include depositing polysilicon substantially on the single oxide layer formed on the first drift region (Pwell1) of the composite drift region of a lowest doping concentration and junction depth to form the gate of the HVPMOS transistor. Also, P+ dopants can be implanted to form the source, and N+ dopants can be implanted to form or allow for the body contact for the HVPMOS transistor, in a remaining region of the deep N-type outside of the composite drift region. Also, P+ dopants can be implanted in the $n^{th}$ drift region of the highest doping concentration and junction depth that is adjacent to the single oxide layer to form the drain of the HVPMOS transistor.

When the thickness of the single oxide layers or regions (e.g., Oxide1, Oxide2, and Oxide3) is the same, the composite oxide layer of a homogeneous thickness between the gate and drain can be configured to accommodate the voltage drop between the gate and drain. However, the portion of the composite oxide layer or region adjacent to the gate can support a lower voltage drop, while the portion of the composite oxide layer adjacent to the drain can support a higher voltage drop. In particular embodiments, the thickness of the single oxide layers or regions (e.g., Oxide1, Oxide2, and Oxide3) can be progressively increased to form a composite oxide layer of progressively increased thickness between the gate and drain from left to right along the horizontal direction of the deep N-type well. This can be similar to the variation of the composite drift region of progressively increased doping concentrations and junction depths, to accommodate an increased voltage drop between the gate and drain.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A high voltage MOS (HVMOS) transistor, comprising:
   a) a semiconductor layer;
   b) a composite drift region having a first doping type in said semiconductor layer;
   c) wherein both a doping concentration and a junction depth of said composite drift region progressively increase along a first direction extending from a gate contact to a drain contact of said HVMOS transistor;
   d) wherein said composite drift region is formed by superimposing n first doping type drift regions along the horizontal direction of said semiconductor layer, wherein n is an integer of at least two, wherein said n drift regions are in sequence a first drift region, a second drift region, to an $n^{th}$ drift region along said first direction, and wherein said drain contact is only in said $n^{th}$ drift region;
   e) a composite oxide layer on said composite drift region, wherein said composite oxide layer comprises at least two adjacent single oxide layers having a same thickness or an increasing thickness along said first direction;
   f) wherein said gate contact is in a gate region of said high voltage MOS transistor, a portion of said gate contact is located on a gate dielectric layer of said high voltage MOS transistor, and a remaining portion is located on said composite oxide layer that is on the surface of said first drift region;
   g) first and second doping type body contacts in a portion of said semiconductor layer that is outside of said composite drift region; and
   h) wherein said drain contact has said first doping type and is in a portion of said $n^{th}$ drift region, and adjacent to said composite oxide layer.

2. The HVMOS transistor of claim 1, wherein along said first direction, said n drift regions are formed by a first time, a second time, to an $n^{th}$ time by implanting first doping type dopants of different doping concentrations in said semiconductor layer in sequence said first drift region, said second drift region, to said $n^{th}$ drift region.

3. The HVMOS transistor of claim 1, wherein the overall implantation dose of said composite drift region changes according to said doping concentration and said junction depth of each of said first doping type drift regions.

4. The HVMOS transistor of claim 1, wherein said composite oxide layer comprises n single oxide layers, and said n single oxide layers are in sequence from a first single oxide layer, to a second single oxide layer, to an $n^{th}$ single oxide layer along said first direction; wherein said first single oxide layer is located on said first drift region, said second single oxide layer is located on said second drift region, and said $n^{th}$ single oxide layer is located on said $n^{th}$ drift.

5. The HVMOS transistor of claim 1, wherein said semiconductor layer comprises a substrate having said first doping type, and a deep well having a second doping type in said substrate, and wherein said composite drift region is located in said deep well.

\* \* \* \* \*